United States Patent
Saxler et al.

(10) Patent No.: US 7,550,784 B2
(45) Date of Patent: Jun. 23, 2009

(54) NITRIDE-BASED TRANSISTORS AND METHODS OF FABRICATION THEREOF USING NON-ETCHED CONTACT RECESSES

(75) Inventors: Adam William Saxler, Durham, NC (US); Richard Peter Smith, Carrboro, NC (US); Scott T. Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 58 days.

(21) Appl. No.: 11/221,343

(22) Filed: Sep. 7, 2005

(65) Prior Publication Data

US 2006/0006435 A1    Jan. 12, 2006

Related U.S. Application Data

(62) Division of application No. 10/617,843, filed on Jul. 11, 2003, now Pat. No. 6,982,204.

(60) Provisional application No. 60/396,236, filed on Jul. 16, 2002.

(51) Int. Cl.
*H01L 29/775* (2006.01)

(52) U.S. Cl. .............. 257/194; 257/192; 257/E29.246; 257/E29.248; 257/E29.249; 257/E29.253; 257/12

(58) Field of Classification Search .............. 257/96, 257/192, 194, E29.246–E29.249, E29.253, 257/12
See application file for complete search history.

(56) References Cited

U.S. PATENT DOCUMENTS

| | | | |
|---|---|---|---|
| 4,424,525 A | 1/1984 | Mimura | 357/23 |
| 4,471,366 A | 9/1984 | Delagebeaudeuf et al. | 357/16 |
| 4,727,403 A | 2/1988 | Hilda et al. | 357/22 |
| 4,755,867 A | 7/1988 | Cheng | |
| 4,788,156 A | 11/1988 | Stoneham et al. | 438/167 |
| 4,946,547 A | 8/1990 | Palmour et al. | 156/643 |
| 5,053,348 A | 10/1991 | Mishra et al. | 437/41 |
| 5,172,197 A | 12/1992 | Nguyen et al. | 357/22 |
| 5,192,987 A | 3/1993 | Khan et al. | 257/183.1 |

(Continued)

FOREIGN PATENT DOCUMENTS

EP        0 334 006 A1    9/1989

(Continued)

OTHER PUBLICATIONS

Beaumont, B. et al., "Epitaxial Lateral Overgrowth of GaN," *Phys. Stat. Sol.* (b) 227, No. 1, pp. 1-43 (2001).

(Continued)

*Primary Examiner*—Ngan Ngo
*Assistant Examiner*—Benjamin Tzu-Hung Liu
(74) *Attorney, Agent, or Firm*—Robert S. Pyles; Myers Bigel Sibley & Sajovec, PA

(57) ABSTRACT

Contacts for a nitride based transistor and methods of fabricating such contacts provide a recess through a regrowth process. The contacts are formed in the recess. The regrowth process includes fabricating a first cap layer comprising a Group III-nitride semiconductor material. A mask is fabricated and patterned on the first cap layer. The pattern of the mask corresponds to the pattern of the recesses for the contacts. A second cap layer comprising a Group III-nitride semiconductor material is selectively fabricated (e.g. grown) on the first cap layer utilizing the patterned mask. Additional layers may also be formed on the second cap layer. The mask may be removed to provide recess(es) to the first cap layer, and contact(s) may be formed in the recess(es). Alternatively, the mask may comprise a conductive material upon which a contact may be formed, and may not require removal.

35 Claims, 8 Drawing Sheets

U.S. PATENT DOCUMENTS

| | | | |
|---|---|---|---|
| 5,200,022 | A | 4/1993 | Kong et al. ............... 156/612 |
| 5,210,051 | A | 5/1993 | Carter, Jr. ................ 437/107 |
| 5,292,501 | A | 3/1994 | Degenhardt et al. .......... 424/49 |
| 5,296,395 | A | 3/1994 | Khan et al. ................ 437/40 |
| 5,298,445 | A | 3/1994 | Asano ..................... 437/40 |
| RE34,861 | E | 2/1995 | Davis et al. ............... 437/100 |
| 5,393,993 | A | 2/1995 | Edmond et al. ............. 257/77 |
| 5,523,589 | A | 6/1996 | Edmond et al. ............. 257/77 |
| 5,534,462 | A | 7/1996 | Fiordalice et al. |
| 5,592,501 | A | 1/1997 | Edmond et al. ............. 372/45 |
| 5,670,798 | A * | 9/1997 | Schetzina .................. 257/96 |
| 5,686,737 | A | 11/1997 | Allen |
| 5,700,714 | A | 12/1997 | Ogihara et al. |
| 5,701,019 | A | 12/1997 | Matsumoto et al. .......... 257/192 |
| 5,705,827 | A | 1/1998 | Baba et al. ................ 257/46 |
| 5,804,482 | A | 9/1998 | Konstantinov et al. |
| 5,885,860 | A | 3/1999 | Weitzel et al. ............. 438/179 |
| 5,929,467 | A * | 7/1999 | Kawai et al. ............... 257/192 |
| 6,028,328 | A | 2/2000 | Riechert et al. ............ 257/194 |
| 6,046,464 | A | 4/2000 | Schetzina .................. 257/96 |
| 6,064,082 | A * | 5/2000 | Kawai et al. ............... 257/192 |
| 6,086,673 | A | 7/2000 | Molnar |
| 6,150,680 | A | 11/2000 | Eastman et al. |
| 6,177,685 | B1 | 1/2001 | Teraguchi et al. ........... 257/20 |
| 6,218,680 | B1 | 4/2001 | Carter, Jr. et al. ........... 257/77 |
| 6,316,793 | B1 | 11/2001 | Sheppard et al. ............ 257/103 |
| 6,429,467 | B1 | 8/2002 | Ando ...................... 257/194 |
| 6,448,648 | B1 | 9/2002 | Boos ....................... 257/751 |
| 6,492,669 | B2 | 12/2002 | Nakayama et al. |
| 6,515,316 | B1 | 2/2003 | Wojtowicz ................. 257/194 |
| 6,548,333 | B2 | 4/2003 | Smith ...................... 438/172 |
| 6,586,781 | B2 | 7/2003 | Wu et al. .................. 257/77 |
| 6,639,255 | B2 | 10/2003 | Inoue et al. ............... 257/194 |
| 2001/0015446 | A1 | 8/2001 | Inoue et al. ............... 257/192 |
| 2001/0020700 | A1 | 9/2001 | Inoue et al. ............... 257/20 |
| 2001/0023964 | A1 | 9/2001 | Wu et al. .................. 257/368 |
| 2001/0040246 | A1 | 11/2001 | Ishii |
| 2002/0008241 | A1 | 1/2002 | Edmond et al. |
| 2002/0017696 | A1 | 2/2002 | Nakayama et al. ........... 257/471 |
| 2002/0066908 | A1 | 6/2002 | Smith ...................... 257/194 |
| 2002/0119610 | A1 | 8/2002 | Nishii et al. |
| 2002/0167023 | A1 | 11/2002 | Charvarkar et al. |
| 2002/0185655 | A1 * | 12/2002 | Fahimulla et al. ........... 257/192 |
| 2003/0017683 | A1 | 1/2003 | Emrick et al. |
| 2003/0020092 | A1 | 1/2003 | Parikh et al. .............. 257/192 |
| 2003/0102482 | A1 | 6/2003 | Saxler ..................... 257/85 |
| 2003/0123829 | A1 | 7/2003 | Taylor |
| 2003/0157776 | A1 | 8/2003 | Smith |
| 2003/0213975 | A1 | 11/2003 | Hirose et al. |
| 2003/0218183 | A1 * | 11/2003 | Micovic et al. ............. 257/192 |
| 2004/0004223 | A1 | 1/2004 | Nagahama et al. |
| 2004/0021152 | A1 | 2/2004 | Nguyen et al. ............. 257/192 |
| 2004/0029330 | A1 | 2/2004 | Hussain et al. ............. 438/172 |
| 2004/0241970 | A1 | 12/2004 | Ring |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 02001230407 | 8/2001 |
| JP | 02002016087 | 1/2002 |
| JP | 2004-342810 | 12/2004 |
| WO | WO 93/23877 | 11/1993 |
| WO | WO 01/57929 | 8/2001 |
| WO | WO 02/48434 | 6/2002 |
| WO | WO03/049193 | 6/2003 |
| WO | WO 2004/008495 | 1/2004 |

OTHER PUBLICATIONS

Ando et al., "10-W/mm AlGaN-GaN HFET With a Field Modulating Plate," *IEEE Electron Device Letters*, 24(5), pp. 289-291 (May 2003).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Gaska et al., "Self-Heating in High-Power AlGaN/GaN HFET's," *IEEE Electron Device Letters*, 19(3), pp. 89-91 (Mar. 1998).

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).

Manfra et al., "Electron Mobility Exceeding 160 000 $cm^2N$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Parikh et al., "Development of Gallium Nitride Epitaxy and Associated Material-Device Correlation for RF, Microwave and MM-wave Applications," Cree, Inc. (35 slides), filed Jun. 16, 2005.

Saxler et al., "III-Nitride Heterostructures on High-Purity Semi-Insulating 4H-SiC Substrates for High-Power RF Transistors," International Workshop on Nitride Semiconductors (Jul. 19, 2004).

Shiojima et al., "Improved Carrier Confinement by a Buried p-Layer in the AlGaN/GaN HEMT Structure," *IEICE Trans. Electron.*, E83-C(12), (Dec. 2000).

"Thick AlN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Silicon Carbide on Diamond Substrates and Related Devices and Methods," U.S. Appl. No. 10/707,898, filed Jan. 22, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117, filed Jun. 16, 2005.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117, (2004).

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Burm et al. "Ultra-Low Resistive Ohmic Contact on *n*-GaN Using Si Implantation," *Applied Physics Letters*, vol. 70, No. 4, 464-66 (1997).

Heikman, et al., "Mass Transport Regrowth of GaN for Ohmic Contacts to AlGaN/GaN," *Applied Physics Letters*. vol. 78, No. 19, pp. 2876 (2001).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

United States Patent Application entitled "Co-Doping for Fermi Level Control in Semi-Insulating Group III Nitrides," filed Jan. 7, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "Methods of Fabricating Nitride-Based Transistors with a Cap Layer and a Recessed Gate," filed Jul. 23, 2004.

United States Patent Application entitled "Methods of Having Laterally Grown Active Region and Methods of Fabricating Same," filed Jul. 26, 2004.

United States Patent Application entitled, "Silicon Carbide on Diamond Substrates and Related Devices and Methods," (Jan. 22, 2004).

Breitschadel et al., "Minimization of Leakage Current of Recessed Gate AlGaN/GaN HEMTs by Optimizing the Dry-Etching Process", Journal of Electronic Materials, vol. 28, No. 12, 1999.

Burm et al., "Recessed Gate GaN MODFETS", Solid State Electronics, vol. 41, No. 2, pp. 247-250, 1997.

Chen et al., "Reactive ion etching for gate recessing for AlGaN/GaN Field-effect transistors", J. Vac. Sci. Technol. B 17(6), Nov./Dec. 1999.

Heikman et al., "Polarization Effects in AlGaN/GaN and GaN/AlGaN/GaN heterostructures", Journal of Applied Physics, vol. 93, No. 12, Jun. 15, 2003, pp. 10114-10118.

Karmalkar et al., Enhancement of Breakdown Voltage in AlGaN/GaN High Electron Mobility Transistors Using a Field Plate, IEEE Transactions on Electron Devices, vol. 48, No. 8, Aug. 2001.

Karmalkar et al., "Resurf AlGaN/GaN HEMT for High Voltage Power Switching", *IEEE Electron Device Letters*, vol. 22, No. 8, Aug. 2001, pp. 373-375.

Kuzmik et al. "Annealing of Schottky contacts deposited on dry etched A1GaN/GaN," *Semiconductor Science and Technology*. vol. 17, No. 11, Nov. 2002.

Neuburger et al. "Design of GaN-based Field Effect Transistor Structures based on Doping Screening of Polarization Fields," WA 1.5, 7th Wide-Bandgap III-Nitride Workshop, Mar. 2002.

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Sarnoff Symposium*, Mar. 18, 1998.

Wu et al. "30-W/mm AlGaN/GaN HEMTs by Field Plate Optimization", *IEEE Electron Device Letters*, Published 2004.

Heikman, Sten J., *MOCVD Growth Technologies for Applications in AlGaN/GaN High Electron Mobility Transistors*, Dissertation, University of California—Santa Barbara, Sep. 2002. 190 pages.

Chu et al., "GaN materials for high power microwave amplifiers," Mat Res. Soc. Symp. Proc., vol. 512 (1998).

Eastman et al., "Undoped AlGaN/GaN HEMTs for Microwave Power Amplification," *IEEE Transactions on Electron Devices*. vol. 48, No. 3, Mar. 2001, p. 479-85.

G. Sullivan et al., "High Power 10-GHz Operation of AlGaN HFETs in Insulating SiC," IEEE Electron Device Letters, vol. 19, No. 6, p. 198, Jun. 1998.

Gaska et al., "Electron transport in AlGaN-GaN heterostructures grown on GH-SiC substrates," Applied Physics Letters, vol. 72, No. 6, Feb. 9, 1998, pp. 707-709.

Gaska et al., "High-Temperature Performance of AlGaN/GaN HFETs in SiC Substrates," IEEE Electron Device Letters. vol. 18, No. 1, p. 492, Oct. 1997.

Gelmont et al., "Monte Carlo simulation of electron transport in gallium nitride," J. Appl. Phys., vol. 74, No. 3, Aug. 1, 1993, pp. 1818-1821.

Heikman et al., "Growth of Fe doped semi-insulating GaN by metalorganic chemical vapor deposition," Applied Physics Letters, vol. 81, No. 3, Jul. 15, 2002, pp. 439-441.

International Search Report, PCT/US02/09398, Aug. 20, 2002.

P.M. Asbeck et al., "Piezoelectric charge densities in AlGaN/GaN HFETs," Electronics Letters, vol. 33., No. 14, pp. 1230-1231, 1997.

Ping et al., "DC and Microwave Performance of High-Current AlGaN/GaN Heterostructure Field Effect Transistors Grown on P-Type SiC Substrates," IEEE Electron Letters. vol. 19, No. 2, p. 54, Feb. 1998.

Sheppard et al, "Improved 10-GHz Operation of GaN/AlGaN HEMTs on Silicon Carbide," *Materials Science Forum*. vols. 338-342, pp. 1643-1646. (2000).

Sheppard et al., "High Power Demonstration at 10 GHz with GaN/AlGaN HEMT Hybrid Amplifiers." Presented at the 58$^{th}$ DRC, Denver, CO Jun. 2000.

Sheppard et al., U.S. Appl. No. 09/096,967 entitled, *Nitride Based Transistors on Semi-Insulating Silicon Carbide Substrates*, filed Jun. 12, 1998.

Wu et al., "High Al-Content AlGaN/GaN MODFET's for Ultrahigh Performance," IEEE Electron Device Letters, vol. 19, No. 2, p. 50, Feb. 1998.

Egawa et al., "Characterizations of Recessed Gate AlGaN/GaN HEMTs on Sapphire," IEEE Transactions on Electron Devices, vol. 48, No. 3, Mar. 2001, pp. 603-608.

International Search Report, PCT/US03/21895, Dec. 9, 2003.

Yu et al., "Schottky barrier engineering in III-V nitrides via the piezoelectric effect," Applied Physics Letters, vol. 73, No. 13, Sep. 28, 1998, pp. 1880-1882.

\* cited by examiner

NITRIDE-BASED TRANSISTORS AND METHODS OF FABRICATION THEREOF USING NON-ETCHED CONTACT RECESSES

CLAIM FOR PRIORITY

The present application is a divisional of U.S. application Ser. No. 10/617,843, filed Jul. 11, 2003, now U.S. Pat. No. 6,982,204, which claims the benefit of U.S. Provisional Application No. 60/396,236, filed Jul. 16, 2002, the disclosure of both of these applications is hereby incorporated by reference in its entirety.

FIELD OF THE INVENTION

The present invention relates to semiconductor devices and, more particularly, to transistors that incorporate nitride-based active layers.

BACKGROUND

The present invention relates to transistors formed of semiconductor materials that can make them suitable for high power, high temperature, and/or high frequency applications. Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/$cm^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes an HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

One issue with the fabrication of nitride-based transistors involves the formation of ohmic contacts for such transistors. Conventionally, ohmic contacts have been formed through reactive ion etching (RIE) recesses for the contacts. However, without strict process control practices, RIE in nitride based materials may suffer from uniformity and reproducibility problems. Such problems could result in difficulty in controlling a fabrication process. Ohmic contacts that are formed without RIE have, typically, used high annealing temperatures (e.g. 900° C.). Such high annealing temperatures may damage the materials and/or the device.

SUMMARY OF THE INVENTION

Embodiments of the present invention provide contacts for a nitride based transistor and methods of fabricating such contacts by providing a recess utilizing a regrowth process. The contacts are formed in the recess. The regrowth process includes fabricating a first cap layer comprising a Group III-nitride semiconductor material. A mask is fabricated and patterned on the first cap layer. The pattern of the mask corresponds to the pattern of the recesses for the contacts. A second cap layer comprising a Group III-nitride semiconductor material is selectively fabricated (e.g. grown) on the first cap layer utilizing the patterned mask. Additional layers may also be formed on the second cap layer. The mask may be removed to provide recess(es) to the first cap layer, and contact(s) may be formed in the recess(es). Alternatively, the mask may comprise a material (conductive or insulating) upon which a contact may be formed, and may not require removal.

In particular, in some embodiments of the present invention, a nitride-based transistor, e.g., a high electron mobility transistor (HEMT) is fabricated. A nitride-based channel layer is formed on a substrate, with or without a buffer layer. A nitride-based semiconductor first cap layer is formed on the nitride-based channel layer. A mask is formed to cover a first portion of the first cap layer and expose an adjacent second portion of the first cap layer. A nitride-based semiconductor second cap layer is formed on the exposed portion of the first cap layer using the mask, e.g., using an epitaxial growth process constrained by the mask. A recess is formed on the first portion of the first cap layer adjacent the second cap layer, for example, by removing the mask to expose the first cap layer or by using a conductive mask upon which the second cap layer does not form. One of an ohmic contact or a gate contact is formed in the recess, and a corresponding gate contact or ohmic contact is formed on the substrate, for example, on the first cap layer and/or on the second cap layer.

The nitride-based channel layer, the nitride-based semiconductor first cap layer, and the nitride-based semiconductor second cap layer may each include a Group-III nitride layer. For example, the channel layer may have a composition of $Al_xGa_{1-x}N$ wherein $0 \leq x < 1$, wherein the bandgap of the channel layer is less than the bandgap of the first cap layer. Similarly, the first cap layer may include $Al_xGa_{1-x}N$ wherein $0 < x < 1$.

The mask may be formed by, for example, patterning a mask layer using a lift-off technique or a wet-etch technique. The mask may be formed from, for example, a silicon oxide (SiOx) material, a silicon nitride (SiNx) or an aluminum nitride (AlN) based material.

The second cap layer may include the same material as the first cap layer. For example, the first and second cap layers may include AlGaN, and wherein the first cap layer has a higher concentration of Al than the second cap layer. A combined thickness of the first and second cap layers may be about 25 nm.

An additional layer may be formed on the second cap layer. The additional layer may include, for example, a GaN cap layer, an insulating layer, and/or a compositionally graded transition layer.

In further embodiments of the present invention, a contact for a nitride-based microelectronic device may be provided. A nitride-based semiconductor first layer is formed on a substrate. A mask is formed to cover a first portion of the first layer and expose an adjacent second portion of the first layer. A nitride-based semiconductor second layer is formed on the exposed portion of the first layer using the mask. A recess is formed on the first portion of the first layer adjacent the second layer. A contact is formed in the recess. The first and second layer may comprise respective Group III-nitride layers.

According to additional embodiments of the present invention, a transistor includes a nitride-based channel layer on a semi-insulating substrate, a nitride-based semiconductor first cap layer on the nitride-based channel layer and a grown nitride-based semiconductor second cap layer on the first cap layer. An ohmic contact or a gate contact is disposed directly on the first cap layer, adjacent a sidewall of the grown second cap layer, and a corresponding gate contact or ohmic contact is disposed on the substrate, for example, on the first cap layer and/or the second cap layer. The first and second cap layers may comprise respective Group III-nitride layers.

DETAILED DESCRIPTION OF EMBODIMENTS OF THE INVENTION

Figure 1A:
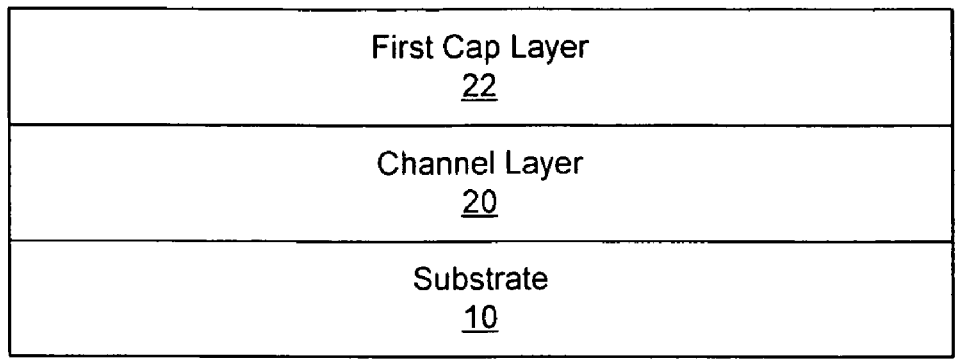
FIGS. 1A-1E are schematic drawings illustrating fabrication of ohmic contacts in a transistor according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. It will also be appreciated by those of skill in the art that references to a structure or feature that is disposed "adjacent" another feature may have portions that overlap or underlie the adjacent feature.

Embodiments of the present invention may provide contacts for a nitride-based device through a regrowth process that provides recesses for formation of the contacts through a thin cap layer. By providing recesses for the contacts, reduced anneal temperatures may be used or an anneal may be avoided. Additionally, lower contact resistances may be achieved. Furthermore, by using a regrowth process RIE may also be avoided. Thus, certain embodiments of the present invention may provide improved reproducibility and uniformity. Furthermore, because of the selective area growth of layers, higher strain layers may be provided without cracking.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in commonly assigned U.S. Pat. Nos. 6,316,793; 6,548,333; 6,849,882; and U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," the disclosures of which are hereby incorporated herein by reference in their entirety.

Fabrication of embodiments of the present invention is schematically illustrated in FIGS. 1A-1E. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. patent application Ser. No. 10/199,786, filed Jul. 19, 2002 and entitled "STRAIN BALANCED NITRIDE HETROJUNCTION TRANSISTORS AND METHODS OF FABRICATING STRAIN BALANCED NITRIDE HETEROJUNCTION TRANSISTORS", and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Although silicon carbide may be the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HVPE.

In some embodiments of the present invention, the channel layer 20 is a Group III-nitride, such as $Al_xGa_{1-x}N$ where $0 \leq x < 1$, provided that the bandgap of the channel layer 20 is less than the bandgap of the first cap layer 22. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A first cap layer 22 is provided on the channel layer 20. The channel layer 20 may have a bandgap that is less than the bandgap of the first cap layer 22. The first cap layer 22 may be deposited on the channel layer 20. In certain embodiments of the present invention, the first cap layer 22 is AlN, AlInN, AlGaN or AlInGaN with a thickness of between about 1 and about 10 nm. Examples of cap layers according to certain embodiments of the present invention are described in U.S. Pat. No. 6,849,882, the disclosure of which is incorporated herein by reference as if set forth fully herein. In particular embodiments of the present invention, the first cap layer 22 is thick enough and has a high enough Al composition and doping to induce a significant carrier concentration at the interface between the channel layer 20 and the first cap layer 22 through polarization effects when the first cap layer 22 is buried under ohmic contact metal. Also, the first cap layer 22 should be thick enough to reduce or minimize scattering of electrons in the channel due to ionized impurities deposited at the interface between the first cap layer 22 and a second cap layer 24.

The first cap layer 22 may be a Group III-nitride and has a bandgap larger than that of the channel layer 20. Accordingly, in certain embodiments of the present invention, the first cap layer 22 is AlGaN, AlInGaN and/or AlN or combinations of layers thereof. The first cap layer 22 may, for example, be from about 1 to about 10 nm thick, but is not so thick as to cause cracking or substantial defect formation therein. Preferably, the first cap layer 22 is undoped or doped with an n-type dopant to a concentration less than about $10^{19}$ $cm^{-3}$. In some embodiments of the present invention, the first cap layer 22 is $Al_xGa_{1-x}N$ where $0<x<1$. In such embodiments, the first cap layer 22 may be from about 3 to about 15 nm thick. In particular embodiments, the aluminum concentration is about 25%. However, in other embodiments of the present invention, the first cap layer 22 comprises AlGaN with an aluminum concentration of between about 5% and about 100%. In specific embodiments of the present invention, the aluminum concentration is greater than about 10%. In embodiments of the present invention where the first cap layer 22 comprises an AlN layer, the thickness of the first cap layer 22 may, for example, be from about 0.3 nm to about 4 nm.

Figure 1B:
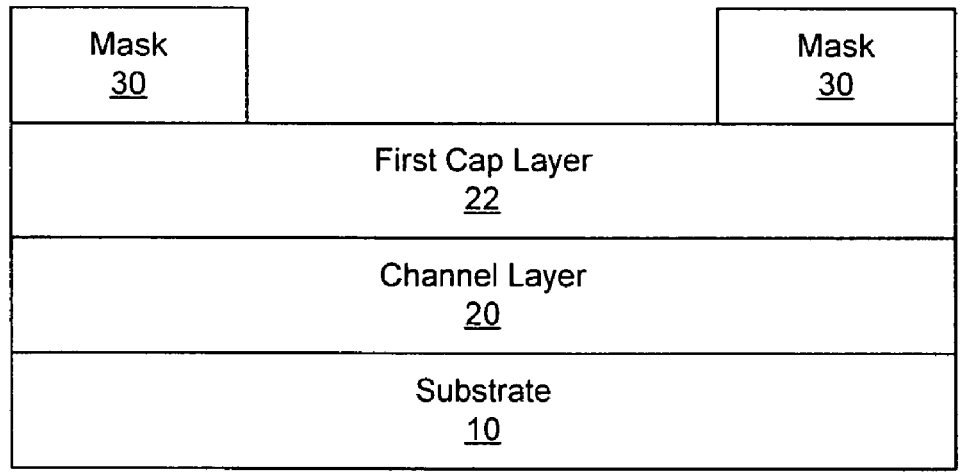

FIG. 1B illustrates formation of a mask 30 on the first cap layer 22. The mask 30 is formed on regions of the first cap layer 22 on which ohmic contacts will subsequently be formed. In certain embodiments of the present invention, the mask 30 is slightly smaller than a size of the contact to be formed on the region of the first cap layer 22 corresponding to the mask 30 to allow for overlap of the ohmic contacts onto the additional layers to compensate for variations in alignment.

As illustrated in FIG. 1B, the wafer of FIG. 1A may be removed from the epi reactor and patterned with a mask material 30 over the desired recess areas. The mask material 30 should be able to withstand the growth temperature of subsequent processing, including the formation of a second cap layer 24 as described below. In certain embodiments of the present invention, the mask 30 is patterned using lift-off techniques to reduce or minimize damage or residue on the top of the first cap layer 22. Alternatively, a wet etch could be utilized to pattern the mask 30. A wet etch may be preferable for patterning over a dry etch to reduce damage to the top of the first cap layer 22. In some embodiments, the mask material 30 is removable with a wet etch that is highly selective relative to the first cap layer 22 and subsequently formed layers. In certain embodiments of the present invention, SiOx is the mask material, although other materials, such as AlN and SiNx based materials, may also be used. The use of AlN based materials as the mask material may improve stability and reduce n-type doping from silicon and oxygen of the SiOx. If AlNx is used, it should be of such quality that it can be removed with selective wet etches.

Figure 1C:
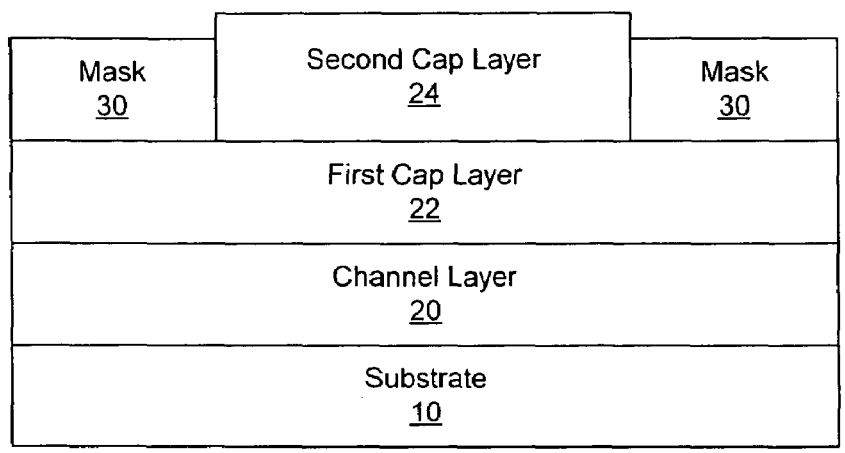

As illustrated in FIG. 1C, after formation and patterning of the mask 30 so as to leave the mask material in the regions where recesses are to be formed for the ohmic contacts, a second cap layer 24 is formed on the exposed regions of the first cap layer 22. For example, the wafer of FIG. 1B may be put back into the epi reactor for deposition of the second cap layer 24. The first cap layer 22 and the second cap layer 24 may be the same or different materials and have the same or different compositions. For example, the first cap layer 22 may be AlN and the second cap layer 24 may be AlGaN or GaN. Furthermore, the first cap layer 22 and the second cap layer 24 may be AlGaN with a higher concentration of Al in the first cap layer 22 than in the second cap layer 24. The total thickness of the first cap layer 22 and the second cap layer 24 may be about 25 nm. The thickness of the first cap layer 22 and the second cap layer 24 together should be thick enough and have enough Al to obtain the desired electron density but not so thick or high enough Al so as to cause cracking or substantial dislocation formation.

Alternatively, selective growth of the second cap layer 24 may be provided by providing a layer on which the material of the second cap layer 24 does not form during the growth/deposition process. For example, a mask could be a thin layer that may be removed by reactive ion etching (RIE). Alternatively, the mask may be a conductive material, such as a metal or other conductive material, such as TaN or TiN, upon which an ohmic contact may be subsequently formed and, therefore, removal of the mask may be unnecessary. In other embodiments, the mask may be formed at an area in which a gate is to be formed, and may comprise an insulating material that may be left (or only partially removed) and used as a gate insulating layer upon which a gate contact is formed.

The pre-patterned regrowth of the second cap layer 24 may also limit cracking in the regions of the second cap layer 24 in the gate/channel regions as the dimension of deposition across the channel/gate regions may be relatively small in comparison to a blanket deposition of the second cap material. In particular, the layers may have a length across the gate/channel regions (e.g., the distance between the masks 30) on the order of a few microns (e.g., about 0.2 to about 10 microns) and a width of up to several hundred microns (e.g., about 10 microns to about 500 microns). In certain embodiments of the present invention, the shape, dimensions, and/or crystallographic orientation of the pattern for the regrowth of the second cap layer 24 are selected to increase or maximize the allowable thickness and Al composition and, therefore, carrier concentration. The region of the second cap layer 24 may be made smaller than the typical crack spacing for a given blanket cap layer to reduce or prevent any cracking within the patterned region. Also, in some embodiments, the orientation should be such that terminating edges of the region are not orthogonal to the preferred crack directions of the crystal to minimize nucleation of cracks as they prefer to start orthogonal to the edges. Furthermore, in certain embodiments of the present invention, the second cap layer 24 has an Al composition below a level at which a substantial second electron channel forms at the regrowth interface between the first cap layer 22 and the second cap layer 24.

Growth conditions for the second cap layer 24 may be chosen to prevent excessive decomposition of mask 30. Also, any deposition on mask 30 is preferably discontinuous enough to allow for wet etching to effectively remove the mask 30 and any deposition above. Preferably, deposition is not selective so the composition of the material of the second cap layer 24, such as an AlGaN composition, and thickness are uniform over the region. A uniform composition and thickness may be achieved by using relatively low growth temperatures and/or more stable masks upon which III-nitrides nucleate (e.g. low quality AlNx vs. SiOx). However, nucleation should not be so complete as to form a continuous layer on the mask 30 so as to facilitate removal of the mask 30. If the growth is selective, then the mask 30 should be sized to reduce and/or limit transport from the mask region to the growth region.

Figure 1D:
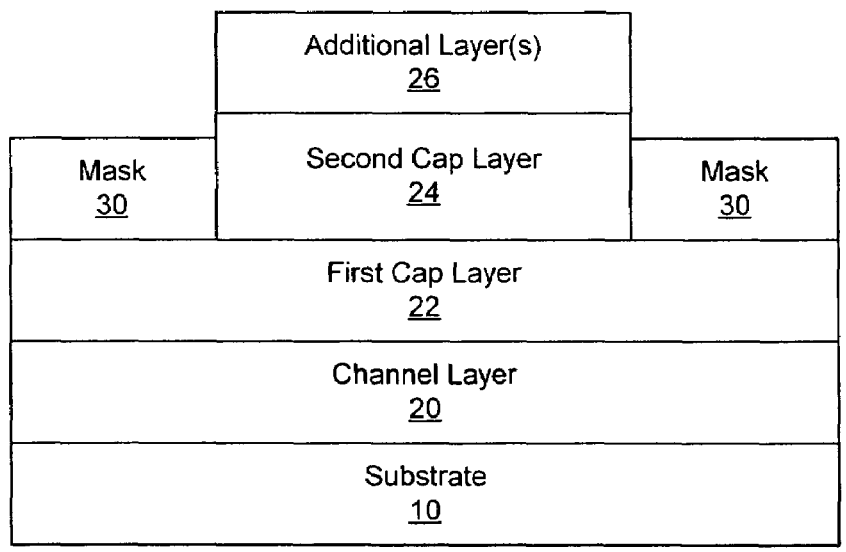

FIG. 1D illustrates the formation of additional layers 26. The additional layers 26 may be deposited either in the epi reactor or externally. Because the ohmic contact regions are already going to be opened, such additional layers 26 may include GaN cap layers, as for example, described in Yu et al., "Schottky barrier engineering in III-V nitrides via the piezoelectric effect," Applied Physics Letters, Vol. 73, No. 13, 1998, or in U.S. Pat. No. 6,548,333, the disclosures of which are incorporated herein by reference as if set forth fully herein. In some embodiments, insulating layers such as SiNx, or relatively high quality AlN may be deposited for making a MISHEMT, passivating the surface, and/or encapsulating the second cap layer 24 during future processing. The additional layers 26 may also include a compositionally graded transition layer on the first and/or second cap layers 22 and/or 24. The additional layers 26 may be deposited in the epi reactor directly after formation of the second cap layer 24 which may allow for improved control of the interface and surface states between the second cap layer 24 and the additional layers 26. Furthermore, because the region of the additional layers 26 has the same smaller region patterning as the second cap layer 24, these layers may also benefit from reduced cracking even if the tensile strain is increased by the additional layers 26.

Figure 1E:
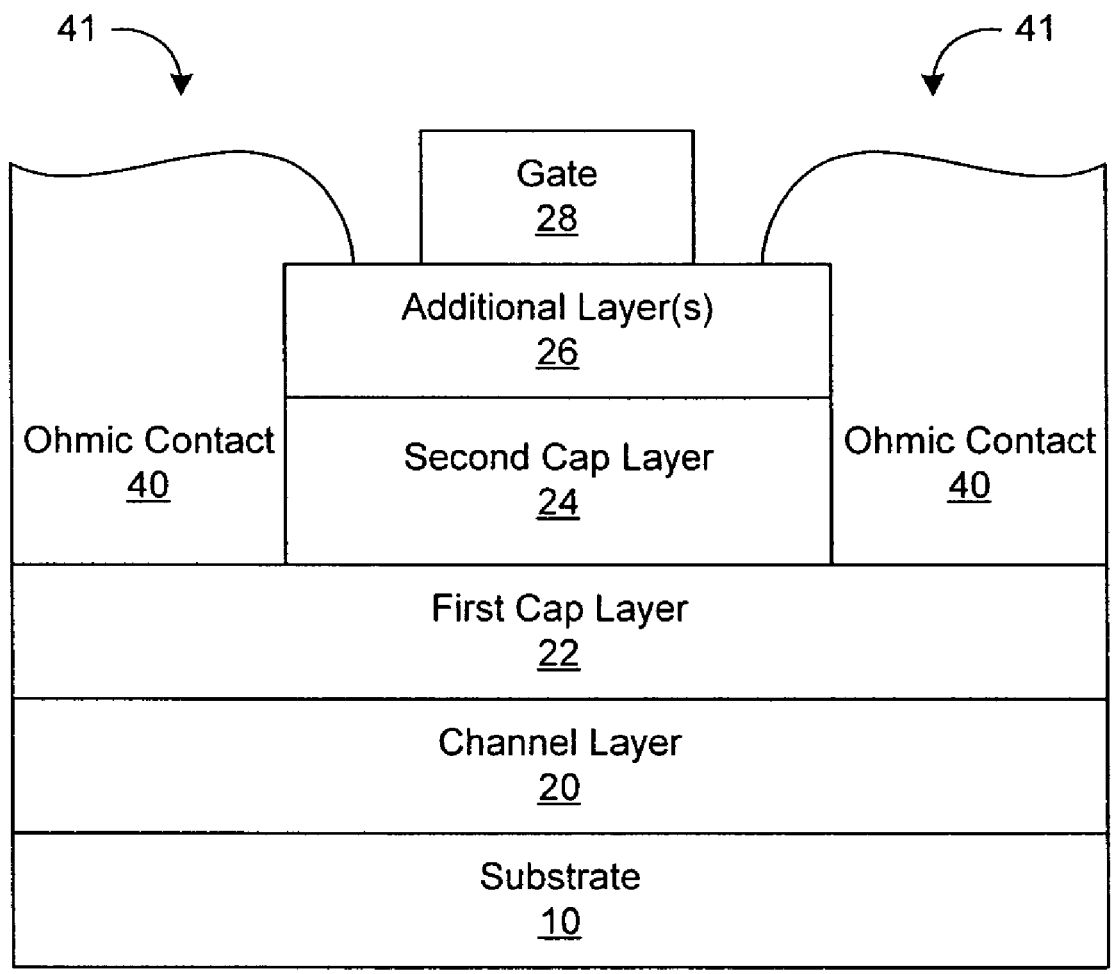

FIG. 1E illustrates removal of the mask 30 and formation of the ohmic contacts 40 in the recesses defined by (i.e., adjacent) the second cap layer 24. The ohmic contacts 40 may be fabricated as described in U.S. Pat. No. 6,316,793. The ohmic contacts 40 are formed on the first cap layer 22. The ohmic contacts 40 on the first cap layer 22 may be annealed at a relatively low anneal temperature. For example, in certain embodiments of the present invention, anneal temperatures of from about 400 to about 800° C. may be used. In other embodiments of the present invention the anneal step may be eliminated. Thus, the ohmic contacts 40 may be provided without the need for high anneal temperatures or to etch the Group III-nitride materials of a cap layer. The transistor may be further completed by addition of a gate 28 and/or gate structure, passivation or other such additional processing as known to those of skill in the art.

The first and/or second cap layer(s) 22 and 24 may also be provided with multiple layers as described in U.S. Pat. No. 6,849,882, the disclosure of which is incorporated herein by reference as if set forth fully herein. Thus, embodiments of the present invention should not be construed as limiting the first and/or second cap layers to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

Optionally, the ohmic regions may be implanted with an n-type dopant such as Si to further reduce contact resistance. If done before the regrowth, the regrowth could serve as the anneal step and/or a higher temperature anneal could be done before the last regrowth layer is deposited so that the final surface would not be affected by the high temperature anneal. For example, the first cap layer 22 may be formed of a thin AlGaN and a mask deposited and patterned to provide an implant mask with openings over the ohmic contact regions and to add alignment marks. A dopant, such as Si (or O, Ge, etc.) is implanted and the implant mask removed. The regrowth mask is then deposited and patterned to cover the ohmic contact regions and the alignment marks. The resulting structure may be annealed (~1100° C. in inert or NH₃ based gas) and an AlGaN layer formed. The regrowth mask is removed and the ohmic contacts formed.

Figure 2:
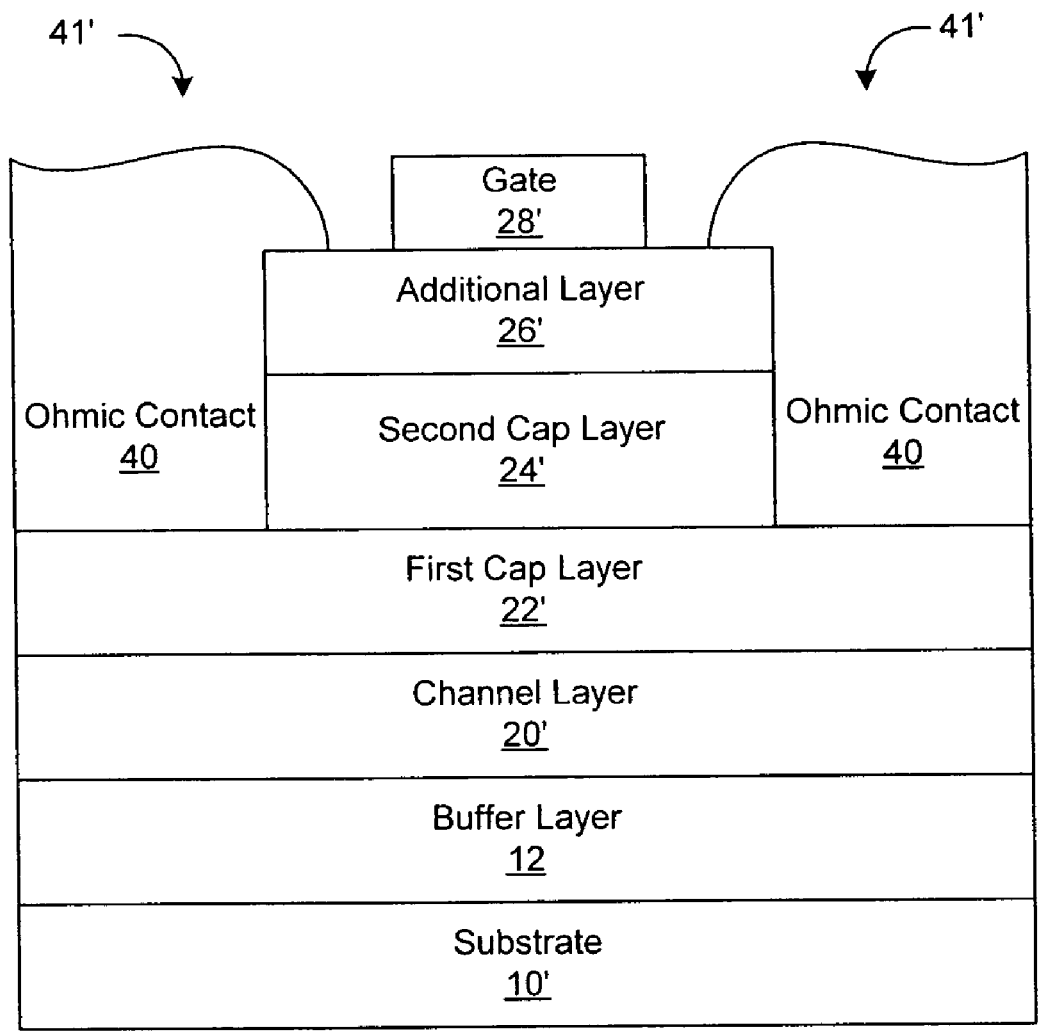
FIG. 2 is a schematic illustration of a transistor according to embodiments of the present invention.

FIG. 2 illustrates an exemplary transistor according to some embodiments of the present invention. As seen in FIG. 2, an AlN buffer layer 12 is formed on a high purity semi-insulating (HPSI) 4H SiC substrate 10'. The buffer layer 12 may be intrinsic or undoped AlN that is about 0.2 μm and the substrate 10' may be about 400 μm thick. The channel layer 20' is on the buffer layer 12 and may be an undoped GaN layer having a thickness of about 2 μm. The first cap layer 22' is on the channel layer 20' and may be an undoped AlGaN layer with an Al concentration of about 25% and a thickness of about 5 nm.

The second cap layer 24' is selectively grown utilizing a mask as described above as a doped AlGaN layer, intentionally or otherwise, with an Al concentration of about 20% and doped with an n-type dopant such as Si to a concentration of about $2 \times 10^{12}$ cm$^{-2}$ total. The second cap layer 24' may have a thickness of about 10 nm. An additional layer 26' is selectively grown utilizing a mask as described above as an undoped AlGaN with an Al concentration of about 20% is also provided on the second cap layer 24'. The additional layer 26' may have a thickness of about 10 nm. Ohmic contacts 40 are formed in the recesses adjacent the second cap layer 24' and the additional layer 26'. A gate contact 28' may be formed on the additional layer 26'.

Figure 3:
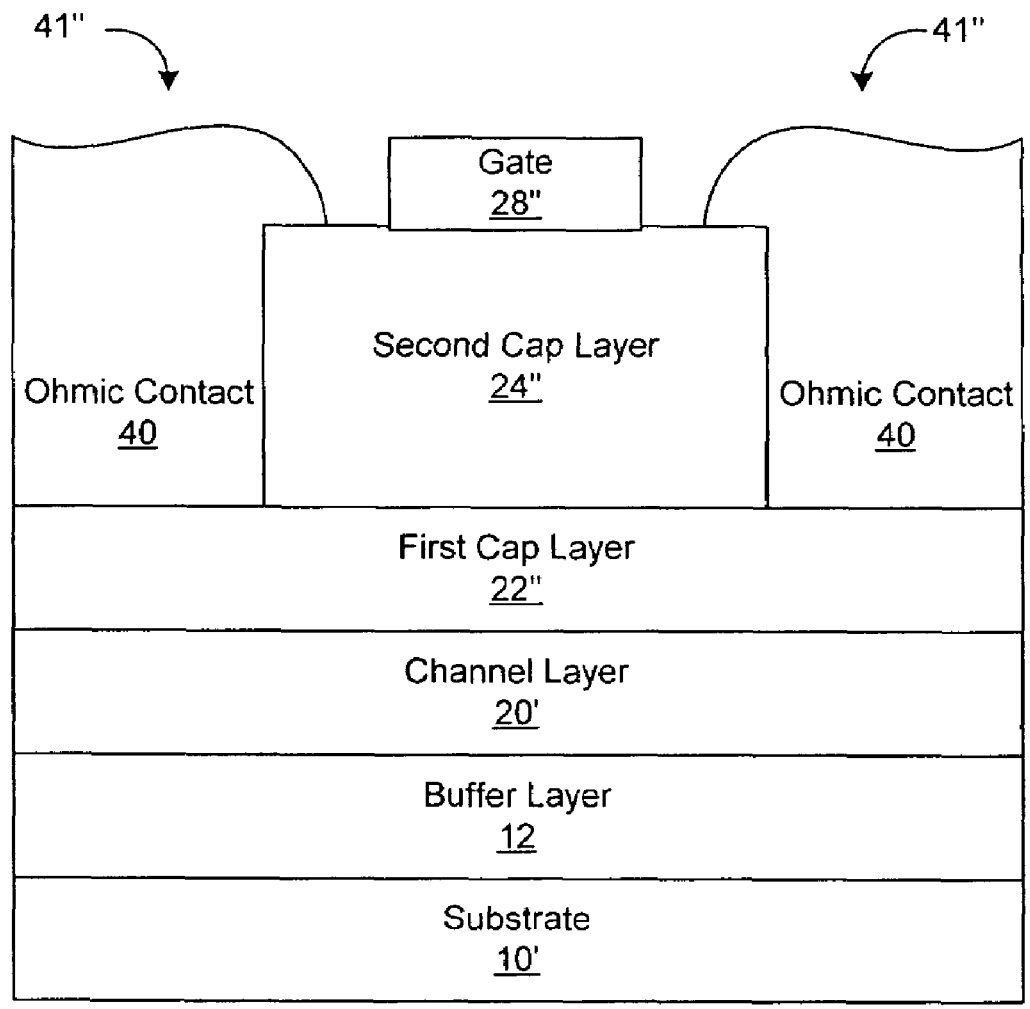
FIG. 3 is a schematic illustration of a transistor according to further embodiments of the present invention.

FIG. 3 illustrates an exemplary transistor according to some embodiments of the present invention utilizing an AlN barrier layer. As seen in FIG. 3, the substrate, the AlN buffer layer 12 and the channel layer 20' may be provided as described above with reference to FIG. 2. The first cap layer 22" is on the channel layer 20' and may be an undoped AlN layer having a thickness of about 1 nm.

The second cap layer 24" is selectively grown utilizing a mask as described above as an undoped AlGaN layer with an Al concentration of about 20%. The second cap layer 24" may have a thickness of about 20 nm. Ohmic contacts 40 are formed in the recesses adjacent the second cap layer 24". A gate contact 28" may be formed on the second cap layer 24".

Figure 4:
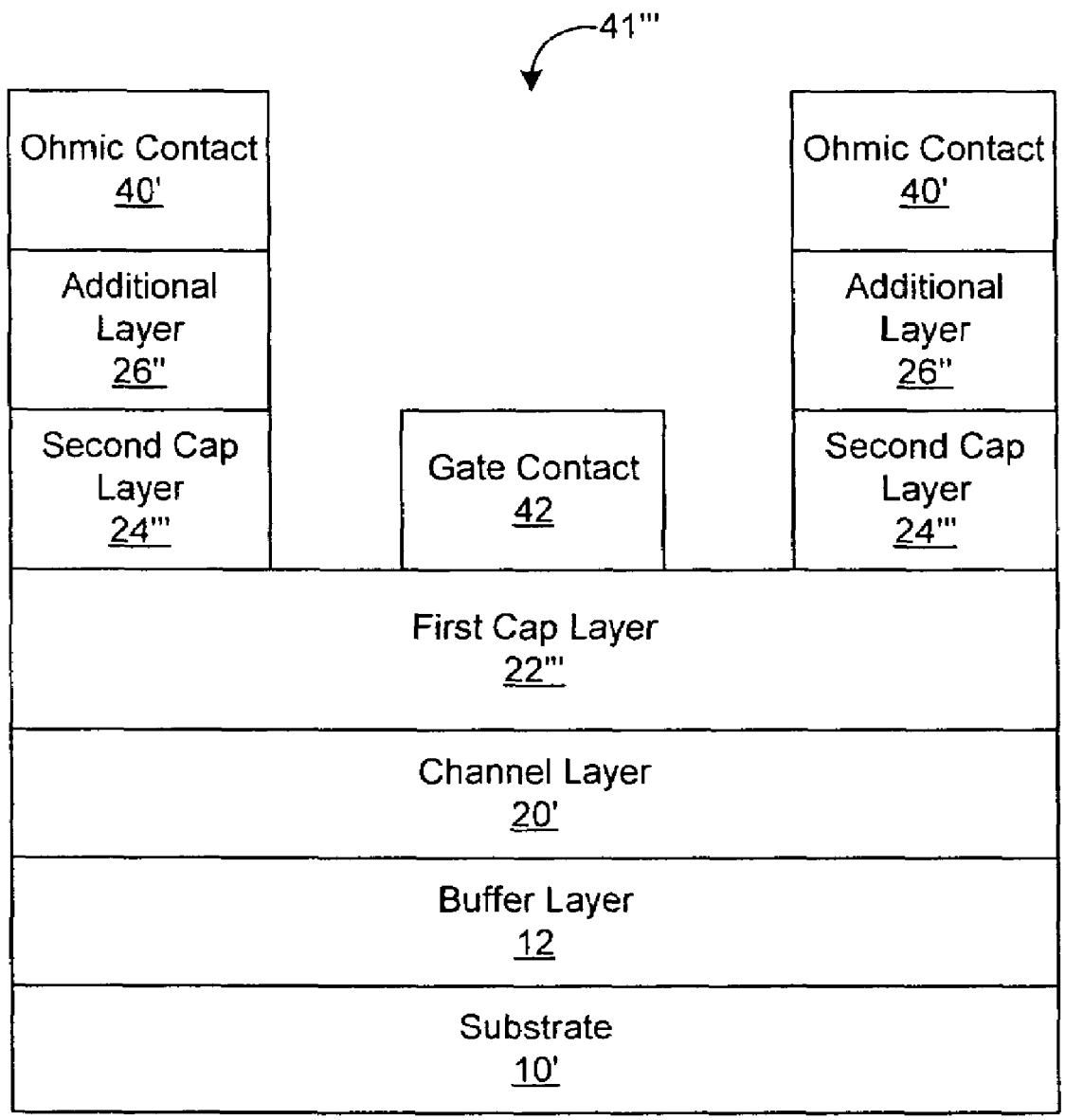
FIG. 4 is a schematic illustration of a transistor having a regrown gate recess according to embodiments of the present invention.

FIG. 4 illustrates an exemplary transistor according to some embodiments of the present invention where the selective regrowth is utilized to provide a recessed gate structure. As seen in FIG. 4, the substrate, the AlN buffer layer 12 and the channel layer 20' may be provided as described above with reference to FIG. 2. The first cap layer 22''' is on the channel layer 20' and may be an undoped AlGaN layer with an Al concentration of about 25% and a thickness of up to about 25 nm.

The second cap layer 24''' is selectively grown utilizing a mask as described above except the mask is used to mask the gate region of the device. The second cap layer 24''' may be an undoped AlGaN layer with an Al concentration of about 20%. The second cap layer 24''' may have a thickness of about 5 nm. An additional layer 26" is selectively grown utilizing a mask as described above as a doped AlGaN layer doped n+, for example, doped to a carrier concentration of from about $10^{18}$ to about $10^{20}$ cm$^{-3}$. The additional layer 26" may have an Al concentration of about 20%. The additional layer 26" may have a thickness of about 10 nm. Ohmic contacts 40' are formed on the additional layer 26". A gate contact 42 may be formed on the first cap layer 22''' in the recess formed by the second cap layer 24''' and the additional layer 26".

Figure 5:
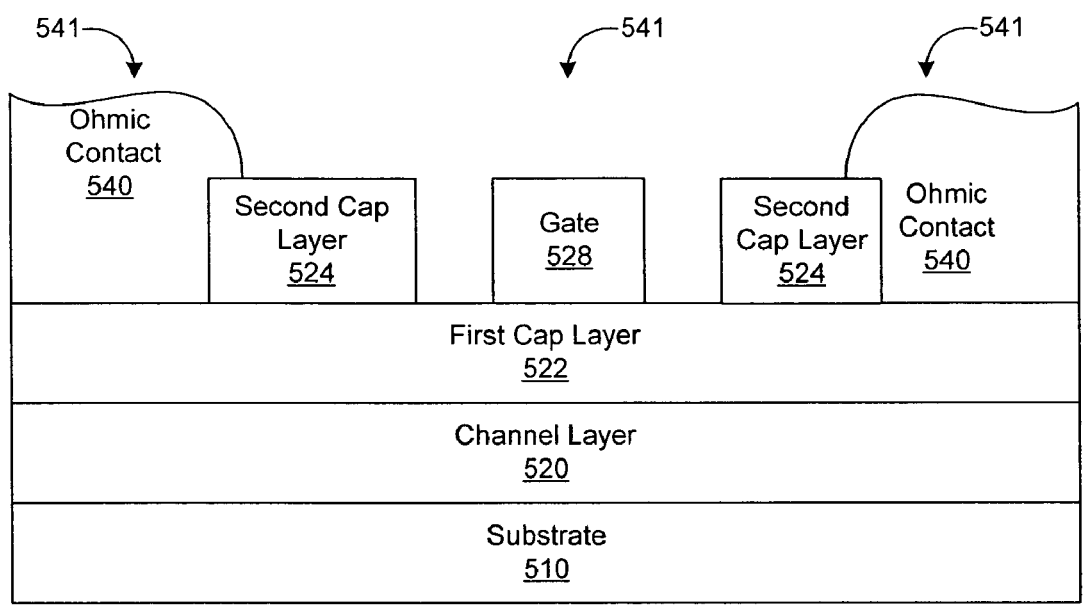
FIG. 5 is a schematic illustration of a transistor according to some embodiments of the present invention.

FIG. 5 shows a transistor according to further exemplary embodiments of the present invention, in which gate and ohmic contacts are both formed in regrown recesses. A channel layer 520 and a first cap layer 522 may be formed on a substrate 510 as described above (it will be appreciated that the substrate 510 may include buffer layers and/or other layers). The first cap layer 522 may be masked to expose portions of the first cap layer 522, and second cap layers 524 may be formed on the exposed portions. The mask may then be removed to leave recesses adjacent the second cap layers 524. Ohmic and gate contacts 540 and 528 may be formed in the recesses, as shown.

Figure 6:
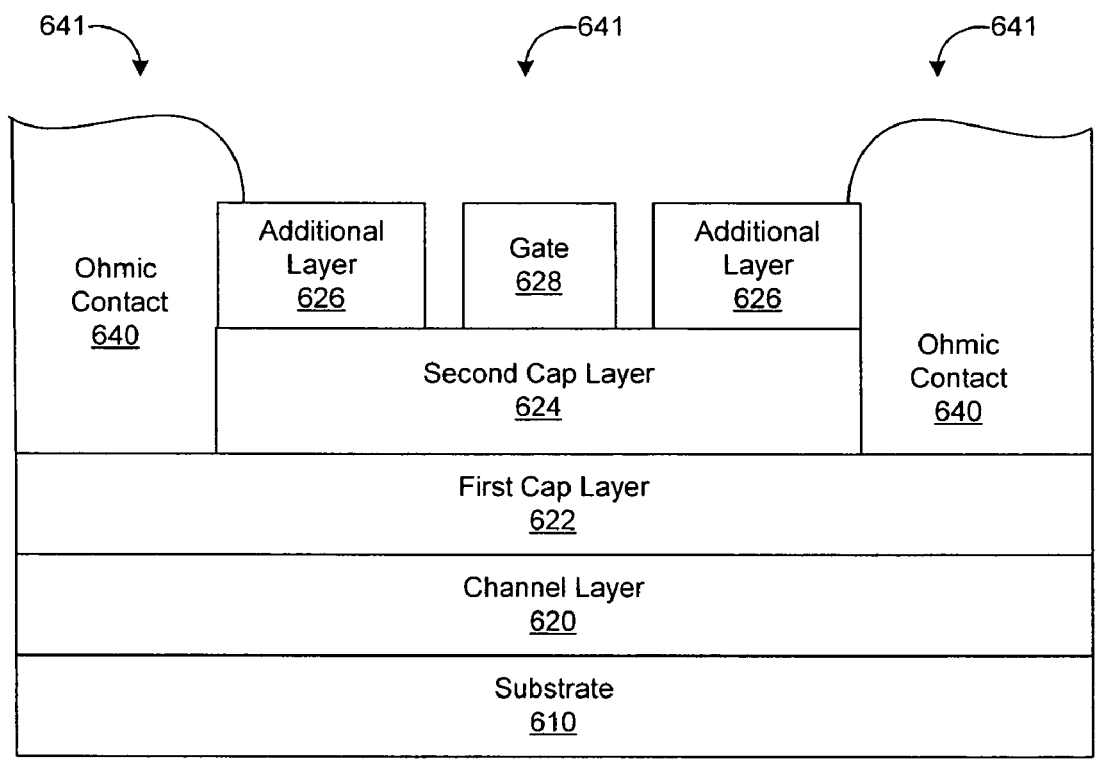
FIG. 6 is a schematic illustration of a transistor according to further embodiments of the present invention.

FIG. 6 shows a transistor according to other exemplary embodiments of the present invention, in which gate and ohmic contacts are both formed in regrown recesses, but on different nitride-based layers. A channel layer 620 and a first cap layer 622 may be formed on a substrate 610 as described above (it will be appreciated that the substrate 610 may include buffer layers and/or other layers). The first cap layer 622 may be masked to expose a portion of the first cap layer 622. A second cap layer 624 may then be formed on the exposed portion. An additional mask may then be formed on the second cap layer 624, leaving spaced apart portions of the second cap layer exposed. Additional layers 626 may be formed on these exposed portions. The masks may be removed to leave recesses that expose first and second portions of the first cap layer 622 and a portion of the second cap layer 624. Ohmic and gate contacts 640 and 628 may be formed in the recesses, as shown. It will be appreciated that the order of masking and contact formation operations may be varied.

In the drawings and specification, there have been disclosed typical embodiments of the invention, and, although specific terms have been employed, they have been used in a generic and descriptive sense only and not for purposes of limitation.

That which is claimed is:

1. A transistor, comprising:
   a nitride-based channel layer;
   a nitride-based semiconductor first cap layer on the nitride-based channel layer;
   a nitride-based semiconductor second cap layer on the first cap layer;
   an ohmic contact disposed directly on top of the first cap layer, adjacent a sidewall of the second cap layer; and
   a corresponding gate contact on the channel layer.

2. A transistor according to claim 1, wherein the corresponding gate contact is on the second cap layer.

3. A transistor according to claim 1,
   wherein the corresponding gate contact is on the first cap layer.

4. A transistor according to claim 3, wherein the channel layer comprises GaN, InGaN, and/or AlInGaN.

5. A transistor according to claim 1:
   wherein the nitride-based channel layer comprises a Group III-nitride layer;
   wherein the nitride-based semiconductor first cap layer comprises a Group III-nitride layer; and
   wherein the nitride-based semiconductor second cap layer comprises a Group-III nitride layer.

6. A transistor according to claim 5, wherein the channel layer has a composition of $Al_xGa_{1-x}N$ wherein $0 \leq x < 1$, and wherein the bandgap of the channel layer. is less than the bandgap of the first cap layer.

7. A transistor according to claim 5, wherein the channel layer comprises an undoped layer having a thickness of greater than about 20 Å.

8. A transistor according to claim 4, wherein the channel layer comprises a superlattice and/or a combination of Group III-nitride layers.

9. A transistor according to claim 4:
wherein the channel layer comprises aluminum gallium nitride (AlGaN), gallium nitride (GaN), indium gallium nitride (InGaN), and/or aluminum indium gallium nitride (AlInGaN);
wherein the first cap layer comprises aluminum nitride (AlN), aluminum indium nitride (AlInN), AlGaN, GaN, InGaN, and/or AlInGaN; and
wherein the second cap layer comprises aluminum nitride (AlN), AlInN, AlGaN, GaN, InGaN, and/or AlInGaN.

10. A transistor according to claim 4, wherein the first cap layer comprises AlN, AlInN, AlGaN, and/or AlInGaN, and has a thickness of 1 nm to about 10 nm.

11. A transistor according to claim 4, wherein the first cap layer is undoped or doped with an n-type dopant to a concentration less than about $10^{19}$ cm$^{-3}$.

12. A transistor according to claim 4, the first cap layer comprises $Al_xGa_{1-x}N$ wherein $0 < x < 1$.

13. A transistor according to claim 12, wherein the first cap layer has a thickness of about 3 nm to about 15 nm.

14. A transistor according to claim 4, wherein the first cap layer comprises AlGaN with an aluminum concentration of between about 5% and about 100%.

15. A transistor according to claim 14, wherein the first cap layer has an aluminum concentration greater than about 10%.

16. A transistor according to claim 4, wherein the first cap layer comprises an AlN layer having a thickness of about 0.3 nm to about 4 nm.

17. A transistor according to claim 4, wherein the channel layer has a lower bandgap than the first cap layer.

18. A transistor according to claim 1, wherein the second cap layer comprises the same material as the first cap layer.

19. A transistor according to claim 18, wherein the first and second cap layers comprise AlGaN, and wherein the first cap layer has a higher concentration of Al than the second cap layer.

20. A transistor according to claim 19, wherein a combined thickness of the first and second cap layers is about 25 nm.

21. A transistor according to claim 1, wherein the second cap layer has an orientation such that terminating edges of the second cap layer are not orthogonal to a preferred crystal crack direction.

22. A transistor according to claim 1, wherein the second cap layer has an Al composition below a level at which a substantial second electron channel forms at a regrowth interface between the first cap layer and the second cap layer.

23. A transistor according to claim 1, further comprising an additional layer on the second cap layer.

24. A transistor according to claim 23, wherein the additional layer comprises at least one of a GaN cap layer, an insulating layer, and a compositionally graded transition layer.

25. A transistor according to claim 1, wherein the first and second cap layers each comprise multiple layers.

26. A transistor according to claim 1, wherein at least one of the first and second cap layers comprises a nitride-based barrier layer.

27. A transistor according to claim 1:
wherein the nitride-based channel layer comprises a Group III-nitride channel layer on a buffer layer;
wherein the nitride-based semiconductor first cap layer comprises a Group III-nitride first cap layer on the channel layer, the first cap layer having a bandgap greater than the channel layer;
wherein the nitride-based semiconductor second cap layer comprises a Group III-nitride second cap layer on the exposed second portion of the first cap layer;
wherein the transistor further comprises a third semiconductor layer on the second cap layer;
wherein the ohmic contact comprises respective ohmic contacts adjacent opposite sidewalls of the second cap layer; and
wherein the corresponding gate contact comprises a gate contact on the third semiconductor layer.

28. A transistor according to claim 27, further comprising:
a high purity semi-insulating (HPSI) 4H SiC substrate having a thickness of about 400μm;
wherein the buffer layer is diposed on the substrate and comprises an intrinsic or undoped AlN layer having a thickness of about 0.2 μm;
wherein the channel layer comprises an undoped GaN layer having a thickness of about 2 μm;
wherein the first cap layer comprises an undoped AlN layer having a thickness of about 1 nm;
wherein the second cap layer comprises an undoped AlGaN layer with an Al concentration of about 20% and a thickness of about 20 nm.

29. A transistor according to claim 27, further comprising:
a high purity semi-insulating (HPSI) 4H silicon carbide (SiC) substrate having a thickness of about 400 μm;
wherein the buffer layer is diposed on the substrate and comprises an intrinsic or undoped AlN layer having a thickness of about 0.2 μm;
wherein the channel layer comprises an undoped GaN layer having a thickness of about 2 μm;
wherein the first cap layer comprises an undoped AlGaN layer with an Al concentration of about 25% and a thickness of about 5 nm;
wherein the second cap layer comprises an n-doped AlGaN layer with an Al concentration of about 20%, a dopant concentration of about $2 \times 10^{12}$ cm$^{-2}$, and a thickness of about 10 nm; and
wherein the third semiconductor layer comprises an undoped AlGaN layer with an Al concentration of about 20% and a thickness of about 10 nm.

30. A transistor according to claim 1, wherein the channel layer and the first and second cap layers are configured to provide an HEMT.

31. A transistor according to claim 1, further comprising a substrate, and wherein the nitride-based channel layer is disposed on the substrate.

32. A transistor according to claim 31, further comprising a buffer layer on the substrate, and wherein the nitride-based channel layer is disposed on the buffer layer.

33. A transistor according to claim 1, wherein the ohmic contact is directly on at least a portion of a sidewall of the second cap layer.

34. A transistor according to claim 1, wherein the bandgap of the first cap layer is larger than the channel layer.

35. A transistor according to claim 1, wherein the first cap layer is directly on the channel layer.

* * * * *